United States Patent
Lee et al.

(10) Patent No.: US 7,629,218 B2
(45) Date of Patent: Dec. 8, 2009

(54) METHOD OF MANUFACTURING A CAPACITOR AND METHOD OF MANUFACTURING A SEMICONDUCTOR DEVICE USING THE SAME

(75) Inventors: Woo-Sung Lee, Yongin-si (KR);
Man-Sug Kang, Suwon-si (KR);
Tae-Han Kim, Suwon-si (KR);
Keum-Joo Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 35 days.

(21) Appl. No.: 11/592,177

(22) Filed: Nov. 3, 2006

(65) Prior Publication Data

US 2007/0111462 A1    May 17, 2007

(30) Foreign Application Priority Data

Nov. 10, 2005    (KR) .................. 10-2005-0107534

(51) Int. Cl.
*H01L 21/8242*    (2006.01)
(52) U.S. Cl. .................. 438/256; 438/399; 438/739; 438/740; 438/E21.649
(58) Field of Classification Search .............. 438/239, 438/250, 253, 256, 393, 396, 399, 739, 740, 438/E21.649
See application file for complete search history.

(56) References Cited

U.S. PATENT DOCUMENTS

| | | | | |
|---|---|---|---|---|
| 5,436,187 | A * | 7/1995 | Tanigawa | 438/396 |
| 6,271,084 | B1 * | 8/2001 | Tu et al. | 438/253 |
| 6,337,267 | B1 * | 1/2002 | Yang | 438/618 |
| 6,528,368 | B1 * | 3/2003 | Park | 438/253 |
| 6,583,056 | B2 * | 6/2003 | Yu et al. | 438/639 |

(Continued)

FOREIGN PATENT DOCUMENTS

JP    2004-186379    7/2004

(Continued)

OTHER PUBLICATIONS

Wolf et al., "Dry Etching for VLSI Fabrication," Silicon Processing for the VLSI Era: vol. 1—Process Technology, Lattice Press (1986), pp. 547-551.*

*Primary Examiner*—M. Wilczewski
*Assistant Examiner*—Toniae M Thomas
(74) *Attorney, Agent, or Firm*—Harness, Dickey & Pierce, P.L.C.

(57) ABSTRACT

Example embodiments relate to a method of manufacturing a capacitor and a method of manufacturing a semiconductor device using the same. Other example embodiments relate to a method of manufacturing a capacitor having improved characteristics and a method of manufacturing a semiconductor device using the same. In a method of manufacturing a capacitor having improved characteristics, an insulation layer, including a pad therein, may be formed on a substrate. An etch stop layer may be formed on the insulation layer. A mold layer may be formed on the etch stop layer. The mold layer may be partially etched by a first etching process to form a first contact hole exposing the etch stop layer. The mold layer may be partially etched by a second etching process to form a second contact hole. The exposed etch stop layer may be etched by a third etching process to form a third contact hole exposing the pad. A native oxide layer on the exposed pad may be removed by a fourth etching process to form a capacitor contact hole. A conductive layer may be formed in the capacitor contact hole to form a capacitor.

18 Claims, 12 Drawing Sheets

U.S. PATENT DOCUMENTS

| | | | |
|---|---|---|---|
| 6,700,153 B2 * | 3/2004 | Oh et al. | 257/309 |
| 6,773,998 B1 * | 8/2004 | Fisher et al. | 438/286 |
| 6,780,777 B2 * | 8/2004 | Yun et al. | 438/706 |
| 2004/0159909 A1 * | 8/2004 | Kim et al. | 257/532 |

FOREIGN PATENT DOCUMENTS

| | | |
|---|---|---|
| KR | 2005-41682 | 5/2005 |
| KR | 2005-64208 | 6/2005 |

* cited by examiner

METHOD OF MANUFACTURING A CAPACITOR AND METHOD OF MANUFACTURING A SEMICONDUCTOR DEVICE USING THE SAME

PRIORITY STATEMENT

This application claims priority under 35 USC § 119 to Korean Patent Application No. 2005-107534 filed on Nov. 10, 2005, in the Korean Intellectual Property Office (KIPO), the entire contents of which are herein incorporated by reference.

BACKGROUND

1. Field of the Invention

Example embodiments relate to a method of manufacturing a capacitor and a method of manufacturing a semiconductor device using the same. Other example embodiments relate to a method of manufacturing a capacitor having improved characteristics and a method of manufacturing a semiconductor device using the same.

2. Description of the Related Art

A semiconductor device (e.g., a dynamic random access memory (DRAM) device) is generally used to memorize information (e.g., data or commands of a program). Information may be inputted into the semiconductor device and/or outputted from the semiconductor device. A unit memory device may include one transistor and one capacitor. The capacitor may include a lower electrode, a dielectric layer and an upper electrode. In order to improve the efficiency of the semiconductor memory device, a capacitance of the capacitor may be increased.

As an integration degree of the semiconductor device is increased, an area per the unit memory cell may be decreased. In order to gain a high capacitance, a structure of the capacitor may have been changed from flat structures to more complex structures (e.g., a box structure and/or a cylindrical structure). In the semiconductor device having a line width of less than about 0.1 μm, an aspect ratio of the capacitor may be increased in order to gain a higher capacitance.

FIGS. 1A and 1B are diagrams illustrating a conventional method of manufacturing a capacitor. Referring to FIG. 1A, an insulating interlayer 10 may be formed on a semiconductor substrate (not shown). A contact hole (not shown) may be formed in the insulating interlayer 10. The contact hole (not shown) may expose a contact region (not shown) in the semiconductor substrate. A pad 15 may be formed in the contact hole (not shown). An etch stop layer 20 may be formed on the pad 15 and the insulating interlayer 10. The etch stop layer 20 may be formed using a nitride.

A mold layer 25 may be formed on the etch stop layer 20. The mold layer 25 may be formed using an oxide (e.g., boro phosphorus silicate glass (BPSG), phosphorus silicate glass (PSG), undoped silicate glass (USG), tetra ethyl ortho silicate (TEOS), plasma enhanced-TEOS (PE-TEOS), high density plasma-chemical vapor deposition (HDP-CVD) oxide and/or any other suitable oxide). A mask layer (not shown) may be formed on the mold layer 25.

Referring to FIG. 1B, the mask layer, the mold layer 25 and the etch stop layer 20 may be successively patterned by a photolithography process. An opening 30 exposing the pad 15 may be formed. Before forming a lower electrode of a capacitor, a pre-cleaning process may be performed. The pre-cleaning process may be performed in order to remove contaminants (e.g., a native oxide layer) formed on the exposed pad 15, thereby increasing a capacitance. The precleaning process may be performed by a wet etching process using an etching solution (e.g., a hydrogen fluoride (HF) solution). The mold layer 25 also may include silicon oxide, so that the mold layer 25 may be partially removed in the pre-cleaning process. The etch stop layer 20 including silicon nitride may not be removed.

Because of the difference in etching rates between the mold layer 25 and the etch stop layer 20, an upper portion 30a of the opening 30 may be wider than a lower portion 30b of the opening 30. The opening 30 may have a step-shaped sidewall. A leaning defect may occur because the distance between the adjacent openings 30 may be shortened. The leaning defect may be a phenomenon that lowers electrodes of the capacitor, so that adjacent lower electrodes make contact with each other.

Considering the pre-cleaning process enlarges the width of the opening 30, a method to narrow the width of the opening 30 more than a given width of the opening 30 may reduce the leaning defect. The lower portion 30b of the opening 30 may not be etched in the pre-cleaning process. The lower portion 30b of the opening 30 in the etch stop layer 20 may sustain an original size, thereby not securing sufficient space to form a lower electrode, an upper electrode and a dielectric layer in the lower portion 30b of the opening 30 during the subsequent processes.

SUMMARY

Example embodiments relate to a method of manufacturing a capacitor and a method of manufacturing a semiconductor device using the same. Other example embodiments relate to a method of manufacturing a capacitor having improved characteristics and a method of manufacturing a semiconductor device using the same.

According to example embodiments, there is provided a method of manufacturing a capacitor. In the method, a mold layer may be formed on an etch stop layer. The mold layer may be partially etched by a first etching process to form a first contact hole exposing the etch stop layer. The mold layer may be partially etched by a second etching process to form a second contact hole having a dimension substantially wider than that of the first contact hole. The exposed etch stop layer may be etched by a third etching process to form a third contact hole exposing the pad. A native oxide layer on the exposed pad may be removed by a fourth etching process to form a capacitor contact hole. The method may further include forming an insulation layer on a substrate, the insulation layer including the pad therein, and forming the etch stop layer on the insulation layer. The method may also include forming a lower electrode in the capacitor contact hole, forming a dielectric layer on the lower electrode and forming an upper electrode on the dielectric layer.

In example embodiments, a dimension of the capacitor contact hole may be substantially the same as that of the third contact hole. In example embodiments, the fourth etching process may include an etching process using plasma. The fourth etching process may be performed using plasma generated from a fluorocarbon ($CF_4$) gas, an oxygen ($O_2$) gas, a hydrogen ($H_2$) gas, a nitrogen ($N_2$) gas and/or a mixture thereof. The third and the fourth etching processes may be simultaneously performed. In example embodiments, the second etching process may include a wet etching process using an SC1 solution or a hydrogen fluoride (HF) solution. The second etching process may include a dry etching process using an etching gas including hydrogen fluoride. In example embodiments, the mold layer may be formed using silicon oxide. The mold layer may be formed using boro phorsphorus silicate glass (BPSG), phosphorus silicate glass (PSG), undoped silicate glass (USG), spin on glass (SOG), flowable oxide (FOX), tetra ethyl ortho silicate (TEOS), plasma enhanced-TEOS (PE-TEOS) and/or high density plasma-chemical vapor deposition (HDP-CVD) oxide.

In example embodiments, the fourth etching process may be performed without expanding the third contact hole. The substrate may be at least one selected from the group including a silicon wafer, a silicon-on-insulator (SOI) substrate and a metal oxide single crystal substrate. The pad may be electrically connected with a lower conductive structure formed below the insulation layer and the pad. The insulation layer may be formed using an oxide. An insulating interlayer may be formed on the insulation layer including the pad. The etch stop layer may be formed using a material having an etching selectivity relative to those of the insulation layer and the mold layer. The method may further include forming a mask layer on the mold layer, forming a photoresist pattern on the mask layer, patterning the mask layer using the photoresist pattern as an etching mask to form a mask pattern and removing the photoresist pattern. The native oxide layer may have an etching rate substantially the same as that of the mold layer.

According to other example embodiments, there is provided a method of manufacturing a semiconductor device. In the method, a contact region may be formed in a substrate. A pad electrically connected with the contact region may be formed on the substrate. Then, a capacitor may be formed as above.

According to example embodiments, a dimension of a contact hole may be gradually expanded while forming a lower electrode of a capacitor. In an etching process of a native oxide layer on a pad connected to the lower electrode, the native oxide layer and a mold layer may be etched with substantially the same etching rates. The mold layer may be desirably etched in the etching process of the native oxide layer, so that an upper dimension of the contact hole may not be expanded into a bottom dimension of the contact hole. The difference in widths between upper portions of the contact hole and lower portions of the contact hole may not be noticeable, so that the contact hole may not have a step-shaped sidewall. The conductive layer may be formed having a uniform thickness in a subsequent process, thereby securing sufficient space to form the lower electrode, a dielectric layer and an upper electrode.

BRIEF DESCRIPTION OF THE DRAWINGS

Example embodiments will be more clearly understood from the following detailed description taken in conjunction with the accompanying drawings. FIGS. 1A to 3H represent non-limiting, example embodiments as described herein.

FIGS. 1A and 1B are diagrams illustrating a conventional method of manufacturing a capacitor;

FIGS. 3A to 3H are diagrams illustrating a method of manufacturing a semiconductor device in accordance with example embodiments.

DESCRIPTION OF EXAMPLE EMBODIMENTS

Figure 1A:
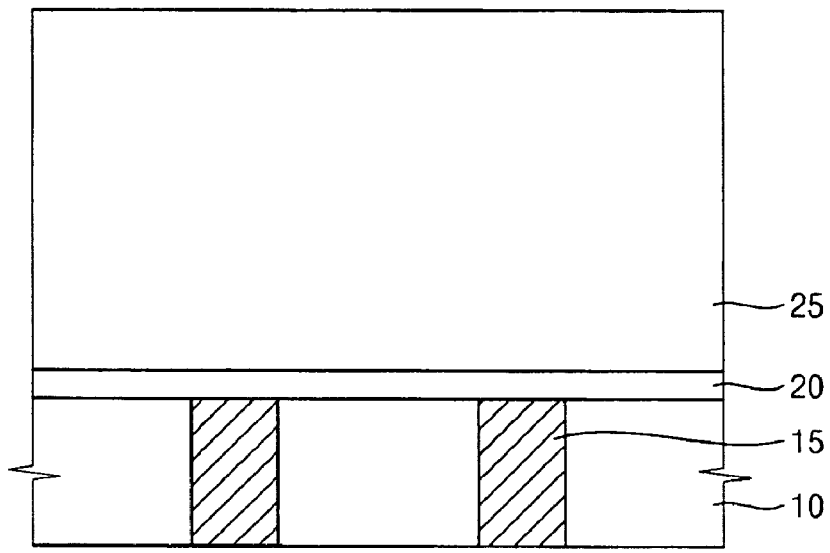
Figure 1B:
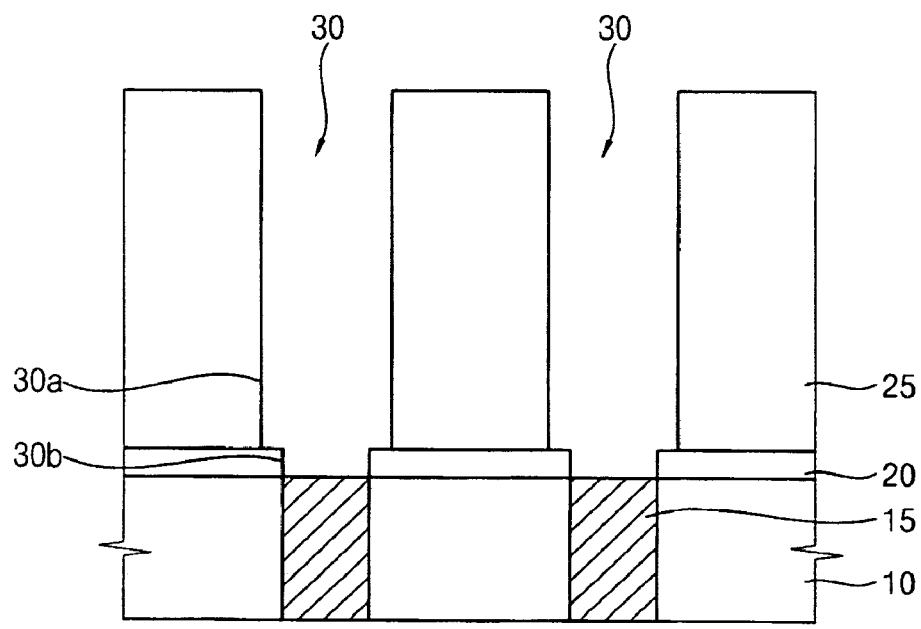

Various example embodiments are described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to a method of manufacturing a capacitor and a method of manufacturing a semiconductor device using the same. Other example embodiments relate to a method of manufacturing a capacitor having improved characteristics and a method of manufacturing a semiconductor device using the same.

Method of Manufacturing a Capacitor

FIGS. 2A to 2F are diagrams illustrating a method of manufacturing a capacitor in accordance with example embodiments.

Figure 2A:
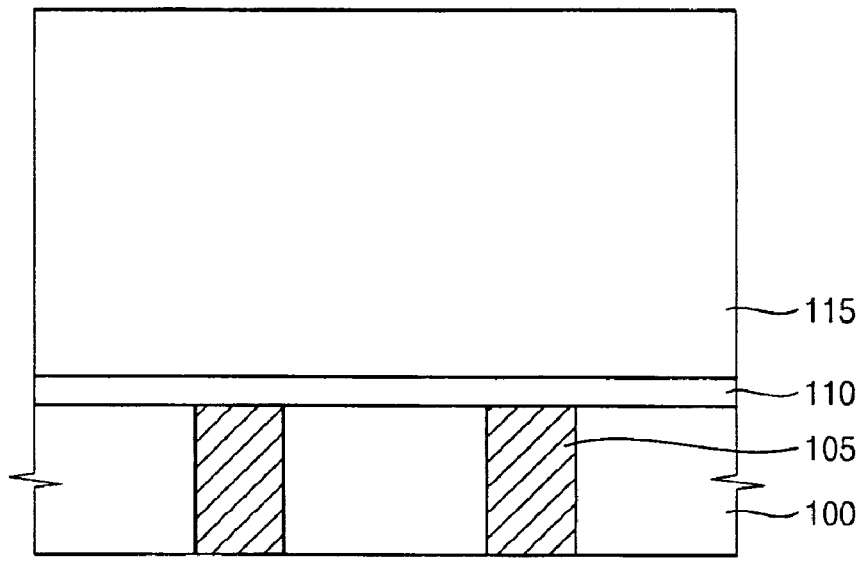
FIGS. 2A to 2F are diagrams illustrating a method of manufacturing a capacitor in accordance with example embodiments.

Referring to FIG. 2A, an insulation layer 100 may be formed on a substrate (not shown). The substrate may include a silicon wafer, a silicon-on-insulator (SOI) substrate, a metal oxide single crystal substrate and/or any other suitable material. The insulation layer 100 may include a pad 105 formed therein. The pad 105 may be electrically connected with a lower conductive structure formed below the insulation layer 100 and the pad 105. The lower conductive structure may include a lower pad, a plug, a contact, a contact region and/or the like. The insulation layer 100 may be formed using an oxide (e.g., silicon oxide). For example, the insulation layer 100 may be formed using a silicon oxide including boro phorsphorus silicate glass (BPSG), phosphorus silicate glass (PSG), undoped silicate glass (USG), spin on glass (SOG), flowable oxide (FOX), tetra ethyl ortho silicate (TEOS), plasma enhanced-TEOS (PE-TEOS), high density plasma-chemical vapor deposition (HDP-CVD) oxide and/or any other suitable silicon oxide.

In example embodiments, an insulating interlayer (not shown) may be further formed on the insulation layer 100 including the pad 105. The insulating interlayer (not shown) may be formed using an oxide (e.g., BPSG, PSG, USG, SOG, FOX, TEOS, PE-TEOS, HDP-CVD oxide and/or any other suitable oxide). The insulating interlayer (not shown) may serve to electrically insulate a lower structure with a lower electrode 133 (see FIG. 2F). The insulating interlayer (not shown) may be planarized by a chemical mechanical polishing (CMP) process, an etch back process and/or a combination process of CMP and etch back. An etch stop layer 110 may be formed on the insulation layer 100 and the pad 105. The etch stop layer 110 may be formed using a material (e.g., silicon nitride) having an etching selectivity relative to those of the insulation layer 100 and a mold layer 115 formed on the etch stop layer 110 in a subsequent process.

The mold layer 115 for forming the lower electrode 133 of a capacitor may be formed on the etch stop layer 110. A thickness of the mold layer 115 may be controlled depending on a capacitance required to the capacitor. Because a height of the capacitor may be mainly decided by the thickness of the mold layer 115, the thickness of the mold layer 115 may be controlled depending on the capacitor required for the semiconductor device. In example embodiments, the mold layer 115 may be formed using an oxide (e.g., BPSG, PSG, USG, SOG, FOX, TEOS, PE-TEOS, HDP-CVD oxide and/or any other suitable oxide). In other example embodiments, the mold layer 115 may be formed in a multi-layered structure using oxides having different etching selectivities.

Figure 2B:
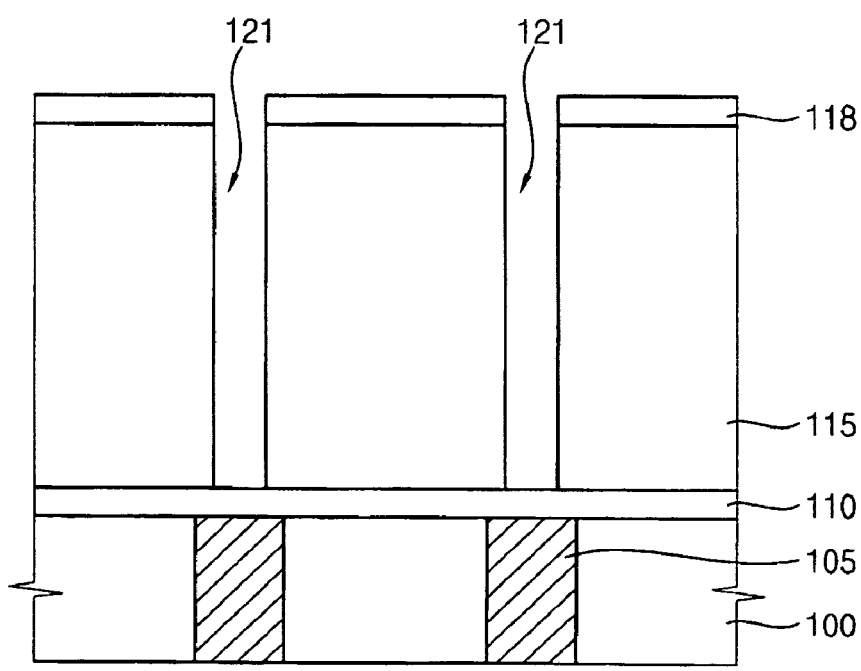

Referring to FIG. 2B, a mask layer may be formed on the mold layer 115. The mask layer may be formed using a material (e.g., silicon nitride) having an etching selectivity relative to that of the mold layer 115. A photoresist pattern (not shown) may be formed on the mask layer. The mask layer may be patterned using the photoresist pattern as an etching mask. A mask pattern 118 may be formed on the mold layer 115. In other example embodiments, an anti-reflective layer may be further formed between the mask layer and the photoresist pattern to gain a margin in a photolithography process.

The photoresist pattern may be removed by an ashing process and/or a stripping process. A first etching process may be performed. In the first etching process, the mold layer 115 may be partially etched using the mask pattern 118 as an etching mask. A first contact hole 121 exposing the etch stop layer 110 may be formed in the mold layer 115 through the first etching process. In example embodiments, the first etching process may include a wet etching process using an etching solution including fluoride (F) (e.g., an LAL solution).

The first contact hole 121 may be further etched by subsequent etching processes. The first contact hole 121 may be formed having a narrower dimension than that of a capacitor contact hole 124 (see FIG. 2D). In other example embodiments, the photoresist pattern may be formed on the mold layer 115, and then the first etching process may be formed using the photoresist pattern as an etching mask to form the first contact hole 121. The first etching process may include a dry etching process using an etching gas including fluorine (F).

Figure 2C:
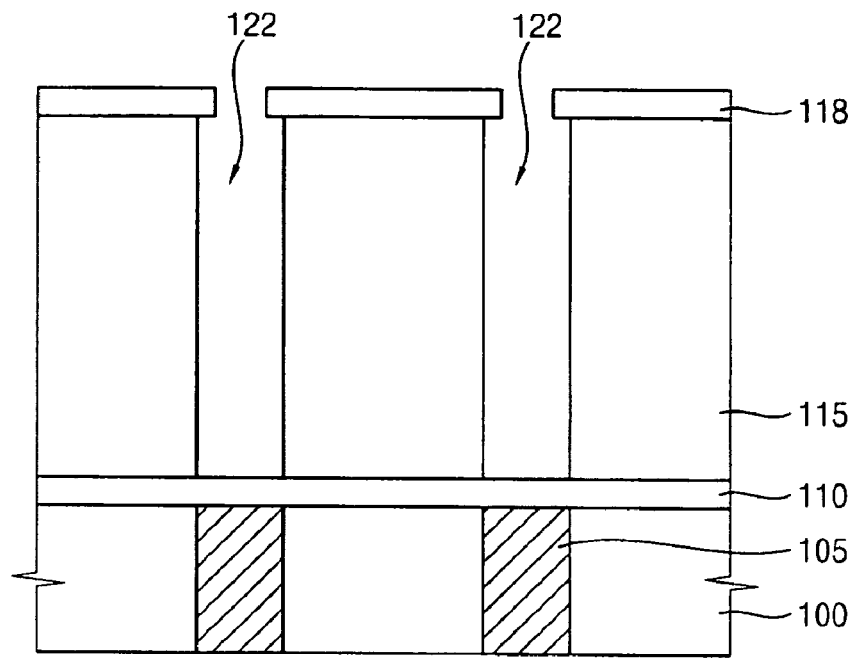

Referring to FIG. 2C, a second etching process may be performed for the first contact hole 121. A second contact hole 122 may be formed in the mold layer 115. The second contact hole 122 may have a substantially wider dimension than that of the first contact hole 121. In example embodiments, the second etching process may include a wet etching process using an etching solution (e.g., an SC1 solution and/or a hydrogen fluoride (HF) solution). In other example embodiments, the second etching process may include a dry etching process using an etching gas including fluoride. The second etching process may serve to remove contaminants, for example, particles, that remain on a sidewall or a bottom surface of the first contact hole 121 after forming the first contact hole 121. The second etching process may also expand a dimension of the lower electrode 133 (see FIG. 2F). Because a sidewall of the mold layer 115 exposed by the first contact hole 121 is partially etched, the second contact hole 122 may have a dimension wider than that of the first contact hole 121. The dimension of the second contact hole 122 may be controlled by an etching solution, an etching gas, a flow rate and/or a processing time in the second etching process.

Figure 2D:
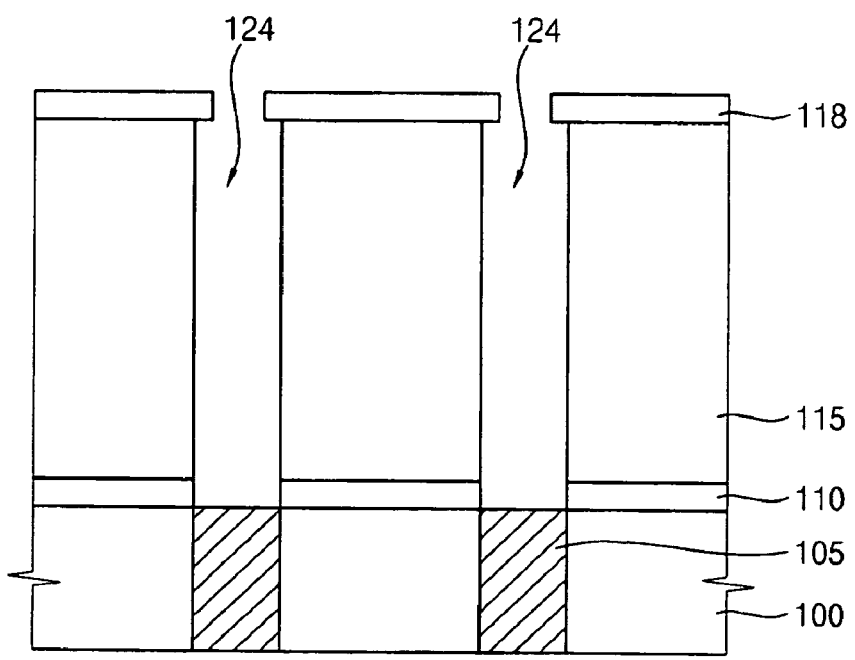

Referring to FIG. 2D, a third etching process may be performed to partially remove the etch stop layer 110 exposed by the second contact hole 122. In example embodiments, the third etching process may be performed using an etching solution including phosphoric acid. A third contact hole 124 exposing the pad 105 may be formed. The third contact hole 124 may have a dimension substantially the same as that of the second contact hole 122. After forming the third contact hole 124, a fourth etching process may be performed. The fourth etching process may serve to remove a native oxide layer formed on the pad 105 exposed by the third contact hole 124. A contact resistance between the lower electrode 133 (see FIG. 2F) and the pad 105 may be improved by removing the native oxide layer from the pad 105 through the fourth etching process. In example embodiments, the fourth etching process may include a plasma native oxide cleaning (PNC) process. The PNC process may be performed using plasma generated from a fluorocarbon ($CF_4$) gas, an oxygen ($O_2$) gas, a hydrogen ($H_2$) gas, a nitrogen ($N_2$) gas and/or a mixture thereof.

The native oxide layer formed on the pad 105 may have an etching rate substantially the same as that of the mold layer 115, so that the mold layer 115 is not undesirably etched relative to the native oxide layer on the pad 105 in the fourth etching process. An upper dimension of the third contact hole 124 may not be undesirably etched. Phenomenon connecting the lower electrode of the capacitor to an adjacent lower electrode may be reduced, or prevented. The difference in widths between upper portions of the third contact hole 124 and lower portions of the third contact hole 124 may be insignificant, so that the third contact hole 124 may not have a step-shaped sidewall. When a conductive layer 127 (see FIG. 2E) is formed, the conductive layer 127 may be formed having a uniform thickness. The etch stop layer 110 does not protrude into the third contact hole 124, thereby reducing the formation of a lower electrode 133 having a narrow width.

Figure 2E:
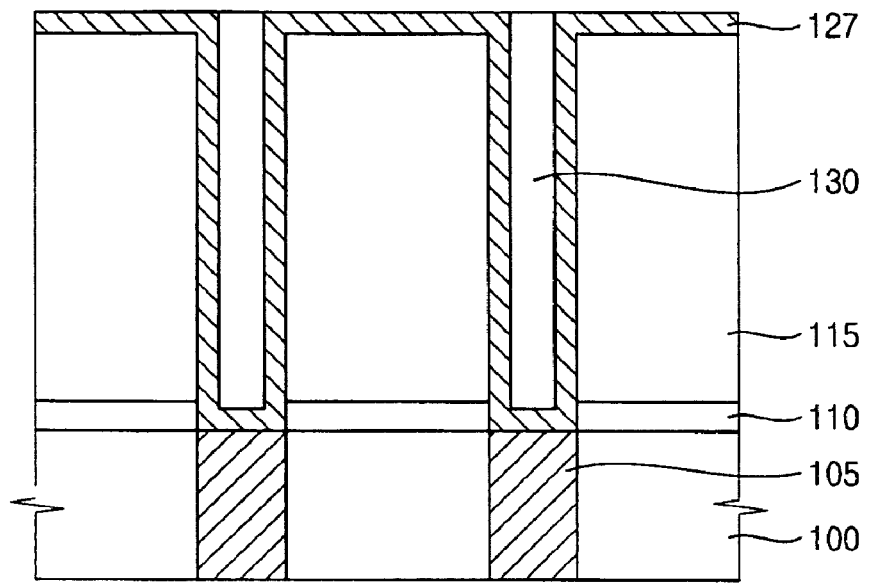

Referring to FIG. 2E, the mask pattern 118 may be removed from the mold layer 115. A conductive layer 127 may be conformably formed on the pad 105, the mold layer 115 and a sidewall of the third contact hole 124. The conductive layer 127 may be formed using polysilicon doped with N type impurities and/or P type impurities, a metal and/or a conductive metal nitride. In example embodiments, the conductive layer 127 may be formed by a low pressure CVD (LPCVD) process using polysilicon and a doping process in order to have a uniform thickness. A sacrificial layer 130 may be formed on the conductive layer 127 to fill up the third contact hole 124. The sacrificial layer 130 may be formed using an oxide (e.g., BPSG, PSG, USG, SOG, FOX, TEOS, PE-TEOS, HDP-CVD oxide and/or any other suitable oxide). In example embodiments, the sacrificial layer 130 may be formed using an oxide substantially the same as that of the mold layer 115. In other example embodiments, the sacrificial layer 130 may be formed using an oxide different from that of the mold layer 115. The sacrificial layer 130 may protect the lower electrode 133 when the conductive layer 127 is partially removed for forming the lower electrode 133.

Figure 2F:
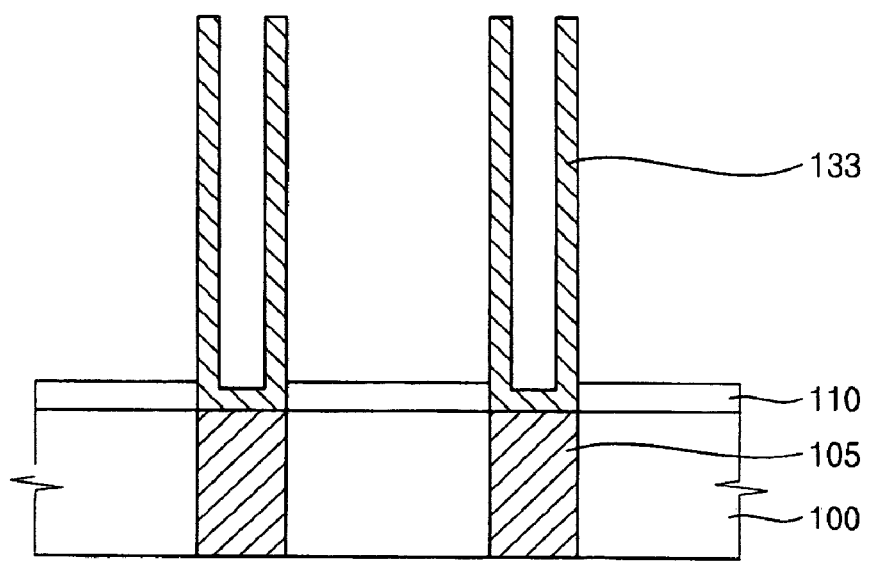

Referring to FIG. 2F, the conductive layer 127 formed on the mold layer 115 may be removed by a CMP process, an etch back process and/or a combination process of CMP and etch back. The sacrificial layer 130 in the third contact hole 124 and mold layer 115 may be removed by a fifth etching process. The fifth etching process may include a wet etching process. The conductive layer 127 may be divided into a unit cell to form the lower electrode 133 of the capacitor. The sacrificial layer 130 and the mold layer 115 may be removed using a BOE solution and/or a hydrogen fluoride (HF) solution. A dielectric layer and an upper electrode (not shown) may be further formed on the lower electrode 133 to form the capacitor.

Method of Manufacturing a Semiconductor Device

Figure 3A:
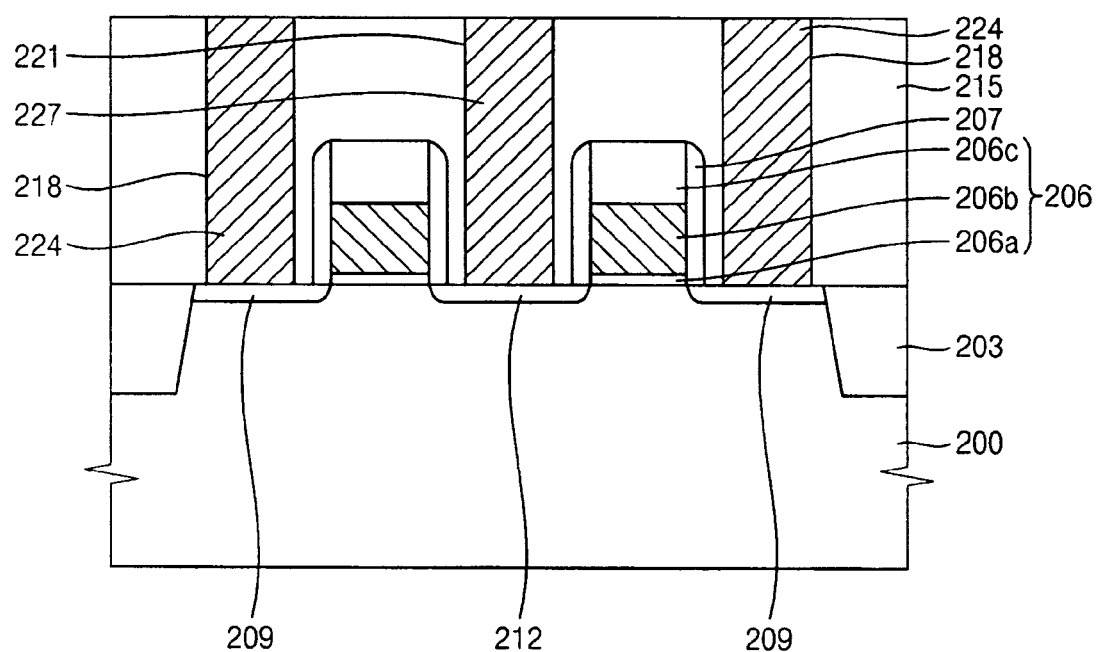

FIGS. 3A to 3H are diagrams illustrating a method of manufacturing a semiconductor device in accordance with example embodiments. Referring to FIG. 3A, an isolation layer 203 may be formed on a substrate 200 by an isolation process (e.g., a shallow trench isolation (STI) process and/or a local oxidation of silicon (LOCOS)). An active region and a field region may be defined in the substrate 200 by the isolation layer 203. The substrate 200 may include a silicon substrate, a silicon germanium substrate, a silicon-on-insulator (SOI) substrate and/or any other suitable material. A gate oxidation layer may be formed on the substrate 200 including the isolation layer 203 therein. The gate oxidation layer may be formed by a thermal oxidation process and/or a CVD process. The gate oxidation layer may be formed on the active region of the substrate 200 defined by the isolation layer 203. The gate oxidation layer may be patterned to form a gate oxidation layer pattern 206a.

A gate conductive layer and a gate mask layer may be successively formed on the gate oxidation layer. The gate conductive layer may be formed using polysilicon doped with impurities and patterned to a gate conductive layer pattern 206b. The gate conductive layer may be formed in a polycide structure including a polysilicon layer and a metal silicide layer. The gate mask layer may be patterned to form a gate mask pattern 206c. The gate mask layer may be formed using a material having an etching selectivity relative to that of a first insulating interlayer 215 formed in a subsequent process. For example, when the first insulating interlayer 215 is formed using an oxide, the gate mask layer may be formed using a nitride (e.g., silicon nitride).

The gate mask layer, the gate conductive layer and the gate oxidation layer may be successively patterned by a photolithography process to form a gate structure 206 on the substrate 200. The gate structure 206 may include the gate oxidation layer pattern 206a, the gate conductive layer pattern 206b and the gate mask pattern 206c. An insulation layer may be formed using a nitride (e.g., silicon nitride) on the substrate 200 including the gate structure 206 thereon. The insulation layer may be anisotropically etched to form a gate spacer 207 on a sidewall of the gate structure 206. A plurality of word lines including the gate structure 206 and the gate spacer 207 may be formed on the substrate 200 parallel to each other.

Impurities may be implanted in the substrate 200 exposed between the word lines by an implantation process. The word lines may be used as an ion implantation mask. A thermal treatment process may be further performed to form a first contact region 209 and a second contact region 212 in the substrate 200. For example, the first contact region 209 may correspond to a source region and the second contact region 212 may correspond to a drain region. Transistor structures including the first and the second contact regions 209 and 212 and the word lines may be formed on the substrate 200.

In other example embodiments, first impurities having a low concentration may be implanted into the substrate 200 exposed between the gate structures 206 before forming the gate spacer 207. After forming the gate spacer 207 on the sidewall of the gate structure 206, second impurities having a high concentration may be implanted into the substrate 200 to form the first and the second contact regions 209 and 212. The first and the second contact regions 209 and 212 may have a lightly doped drain (LDD) structure.

The first insulating interlayer 215 may be formed on the substrate 200 using an oxide to cover the transistor structures. The first insulating interlayer 215 may be formed by a CVD process, a plasma enhanced CVD (PECVD) process, an atomic layer deposition (ALD) process, a high density plasma-CVD (HDP-CVD) process and/or any other suitable process. The first insulating interlayer 215 may be formed using an oxide (e.g., BPSG, PSG, USG, SOG, FOX, TEOS, PE-TEOS, HDP-CVD oxide and/or any other suitable oxide).

The first insulating interlayer 215 may be partially removed by a CMP process, an etch back process and/or a combination process of CMP and etch back to planarize the first insulating interlayer 215. The first insulating interlayer 215 may have a given height from the gate structure 206. In other example embodiments, the first insulating interlayer 215 may be removed until an upper surface of the gate structure 206 is exposed.

A first photoresist pattern (not shown) may be formed on the first insulating interlayer 215. The first insulating interlayer 215 may be etched using the first photoresist pattern as an etching mask to form a first opening 218 and a second opening 221. The first and the second openings 218 and 221 may expose the first and the second contact regions 209 and 212, respectively.

The first photoresist pattern may be removed by an ashing process and/or a stripping process. A first conductive layer may be formed on the first insulating interlayer 215 to fill up the first and the second openings 218 and 221. In example embodiments, the first conductive layer may be formed using polysilicon doped with impurities or a metal.

The first conductive layer may be partially removed by a CMP process, an etch back process and/or a combination process of CMP and etch back until the first insulating interlayer 215 is exposed. A first pad 224 may be formed in the first opening 218 and a second pad 227 may be formed in the second opening 221. The first pad 224 may be electrically connected with the first contact region 209 and the second pad 227 may be electrically connected with the second contact region 212. For example, the first pad 224 may correspond to a capacitor contact pad and the second pad 227 may correspond to a bit line contact pad. In other example embodiments, when the first insulating interlayer 215 may have a height substantially the same as that of the gate structure 206, the first conductive layer may be removed until the gate structure 206 is exposed. The first and the second pads 224 and 227 may be formed as self-aligned contact pads.

Figure 3B:
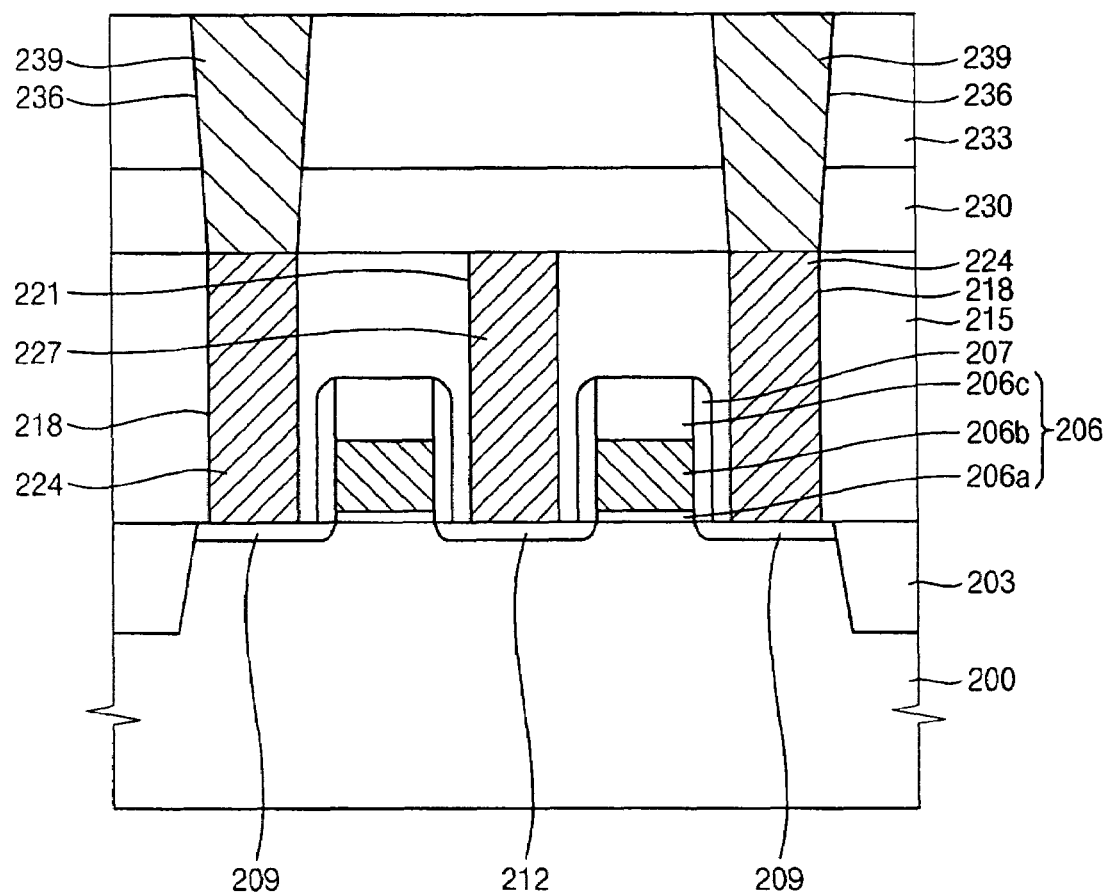

Referring to FIG. 3B, a second insulating interlayer 230 may be formed on the first insulating interlayer 215 including the first and the second pads 224 and 227 therein. The second insulating interlayer 230 may serve to electrically insulate the first pad 224 with a bit line formed in a subsequent process. The second insulating interlayer 230 may be formed using an oxide (e.g., BPSG, PSG, USG, SOG, FOX, TEOS, PE-TEOS, HDP-CVD oxide and/or any other suitable oxide). In example embodiments, the second insulating interlayer 230 may be formed using an oxide substantially the same as that of the first insulating interlayer 215. In other example embodiments, the second insulating interlayer 230 may be formed using an oxide different from that of the first insulating interlayer 215. The second insulating interlayer 230 may be partially removed by a CMP process, an etch back process and/or a combination process of CMP and etch back to planarize the second insulating interlayer 230. A bit line (not shown) may be formed in the first insulating interlayer 230. The bit line may include a bit line conductive layer pattern and a bit line mask pattern.

A third insulating interlayer 233 may be formed on the second insulating interlayer 230 to cover the bit line. The third insulating interlayer 233 may be formed using an oxide (e.g., BPSG, PSG, USG, SOG, FOX, TEOS, PE-TEOS, HDP-CVD oxide and/or any other suitable oxide). The third insulating interlayer 233 may be formed using an oxide substantially the same as that of the second insulating interlayer 230 or different from that of the second insulating interlayer 230. The third insulating interlayer 233 may be partially removed by a CMP process, an etch back process and/or a combination process of CMP and etch back to planarize the third insulating interlayer 233.

A second photoresist pattern (not shown) may be formed on the third insulating interlayer 233. The third insulating interlayer 233 may be etched using the second photoresist pattern as an etching mask to form a third opening 236. The third opening 236 may expose the first pad 224 through the second and the third insulating interlayers 230 and 233. A second conductive layer may be formed on the third insulating interlayer 233 to fill up the third opening 236. The second conductive layer may be partially removed until the third insulating interlayer 233 is exposed. A third pad 239 may be formed in the third opening 236. The third pad 239 may include polysilicon doped with impurities, a metal and/or a conductive metal nitride. The third pad 239 may electrically connect the first pad 224 with a lower electrode 263 (see FIG. 3H).

In example embodiments, a fourth insulating interlayer may be further formed on the third insulating interlayer 233 including the third pad 239 therein. The fourth insulating interlayer may be formed using an oxide (e.g., BPSG, PSG, USG, SOG, FOX, TEOS, PE-TEOS, HDP-CVD oxide and/or any other suitable oxide). The fourth insulating interlayer may serve to electrically insulate the bit line with the lower electrode 263 of the capacitor. The fourth insulating interlayer may be partially removed by a CMP process, an etch back process and/or a combination process of CMP and etch back to planarize the fourth insulating interlayer.

Figure 3C:
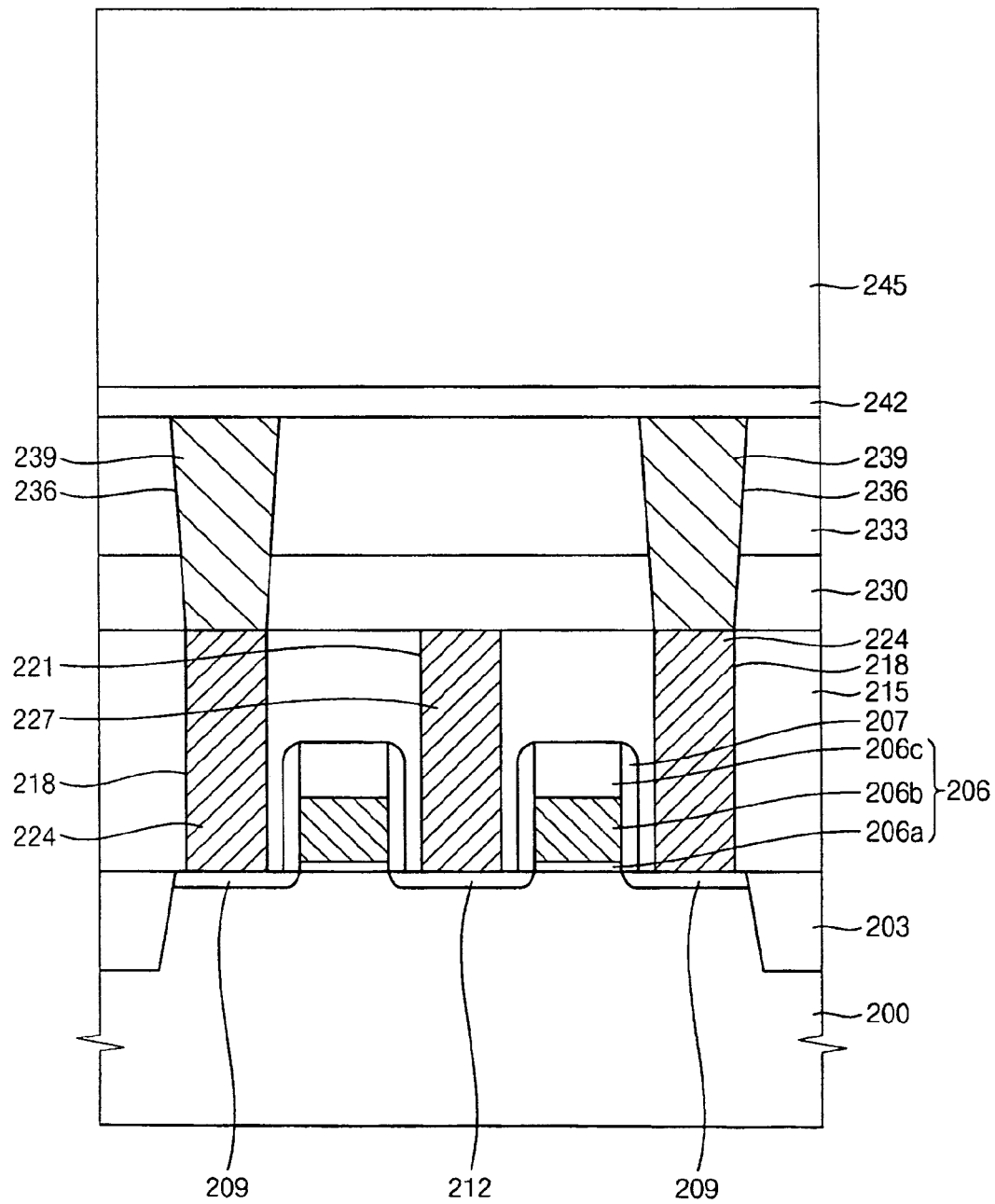

Referring to FIG. 3C, an etch stop layer 242 may be formed on the third pad 239 and the third insulating interlayer 233. The etch stop layer 242 may be formed using a material having an etching selectivity relative to those of the third insulating interlayer 233 and a mold layer 245 formed in a subsequent process. For example, when the mold layer 245 is formed using an oxide (e.g., silicon oxide), the etch stop layer 242 may be formed using a nitride (e.g., silicon nitride). The mold layer 245 for forming the lower electrode of the capacitor may be formed on the etch stop layer 242. A height of the capacitor may be decided depending on a thickness of the mold layer 245 so that the thickness of the mold layer 245 may be controlled in order to form the capacitor having a capacitance required for the semiconductor device.

In example embodiments, the mold layer 145 may be formed using an oxide (e.g., BPSG, PSG, USG, SOG, FOX, TEOS, PE-TEOS, HDP-CVD oxide and/or any other suitable oxide). In other example embodiments, the mold layer 145 may be formed in a multi-layered structure using more than two oxides. The oxides may have different etching rates in an etching process using an etching solution or an etching gas including fluorine.

Figure 3D:
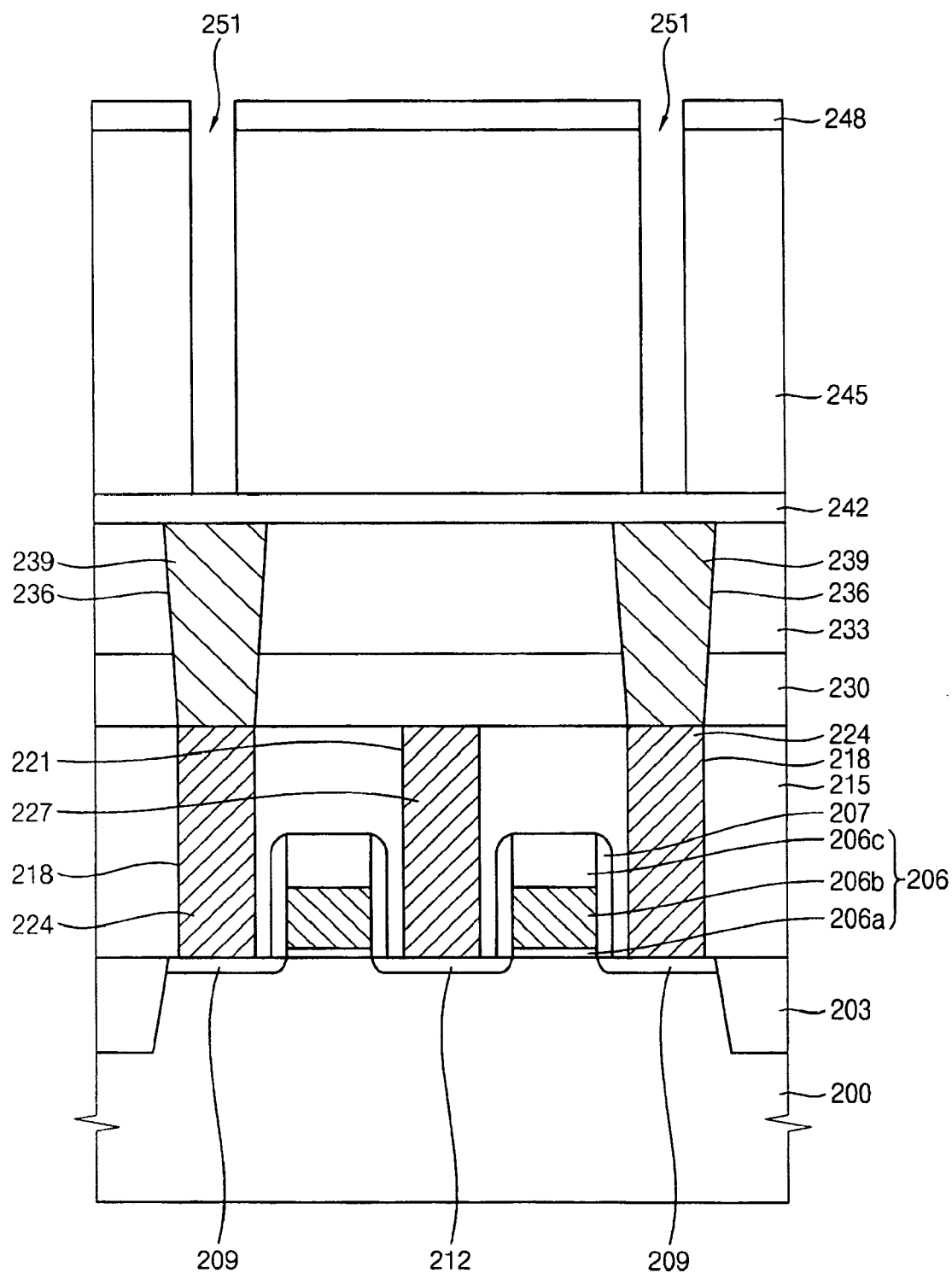

Referring to FIG. 3D, a mask layer may be formed on the mold layer 245. The mask layer may be formed using a material having an etching selectivity relative to that of the mold layer 245. For example, the mask layer may be formed using polysilicon or silicon nitride. A third photoresist pattern (not shown) may be formed on the mask layer. The mask layer may be etched using the third photoresist pattern as an etching mask to form a mask pattern 248 on the mold layer 245. In other example embodiments, an anti-reflective layer may be further formed between the mask layer and the third photoresist pattern so as to gain a sufficient margin in a photolithography process. The third photoresist pattern may be removed by an ashing process and/or a stripping process.

The mold layer 245 may be partially etched using the mask pattern 248 as an etching mask in a first etching process. A first contact hole 251 exposing the etch stop layer 242 may be formed through the mold layer 245. In example embodiments, the first etching process may include a wet etching process using an etching solution including fluorine (F). Because the first contact hole 251 may be further etched in a subsequent process, the first contact hole 251 may be formed to have a dimension narrower than that of a contact hole 254 (see FIG. 3F).

In other example embodiments, the third photoresist pattern may be formed on the mold layer 245. In the first etching process, the mold layer 245 may be etched using the third photoresist pattern as an etching mask to form the first contact hole 251 exposing the etch stop layer 242.

Figure 3E:
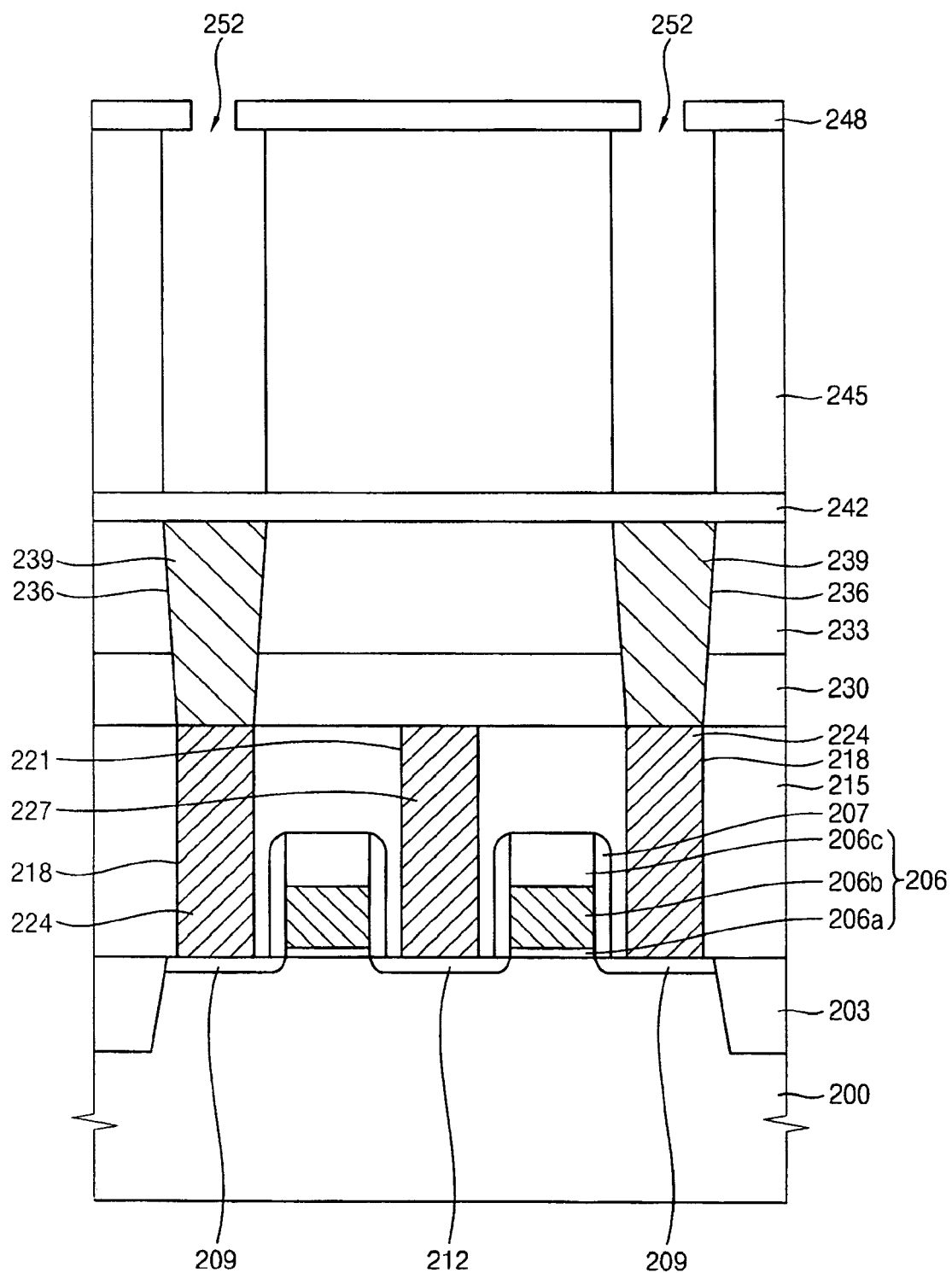

Referring to FIG. 3E, after forming the first contact hole 251, a second etching process may be performed to form a second contact hole 252. In example embodiments, the second etching process may include a wet etching process using an SC1 solution and/or a hydrogen fluoride (HF) solution. In other example embodiments, the second etching process may include a dry etching process using an etching gas including hydrogen fluoride.

Contaminants, for example, particles, that remain on a bottom surface or a sidewall of the first contact hole 251 in a formation of the first contact hole 251 may be removed by the second etching process. Because a sidewall of the mold layer 245 exposed by the first contact hole 251 is partially etched, the second contact hole 252 may be formed having a wider dimension than that of the first contact hole 251 by the second etching process. A dimension of the second contact hole 252 may be controlled by an etching solution, an etching gas, a flow rate and/or a processing time in the second etching process.

Figure 3F:
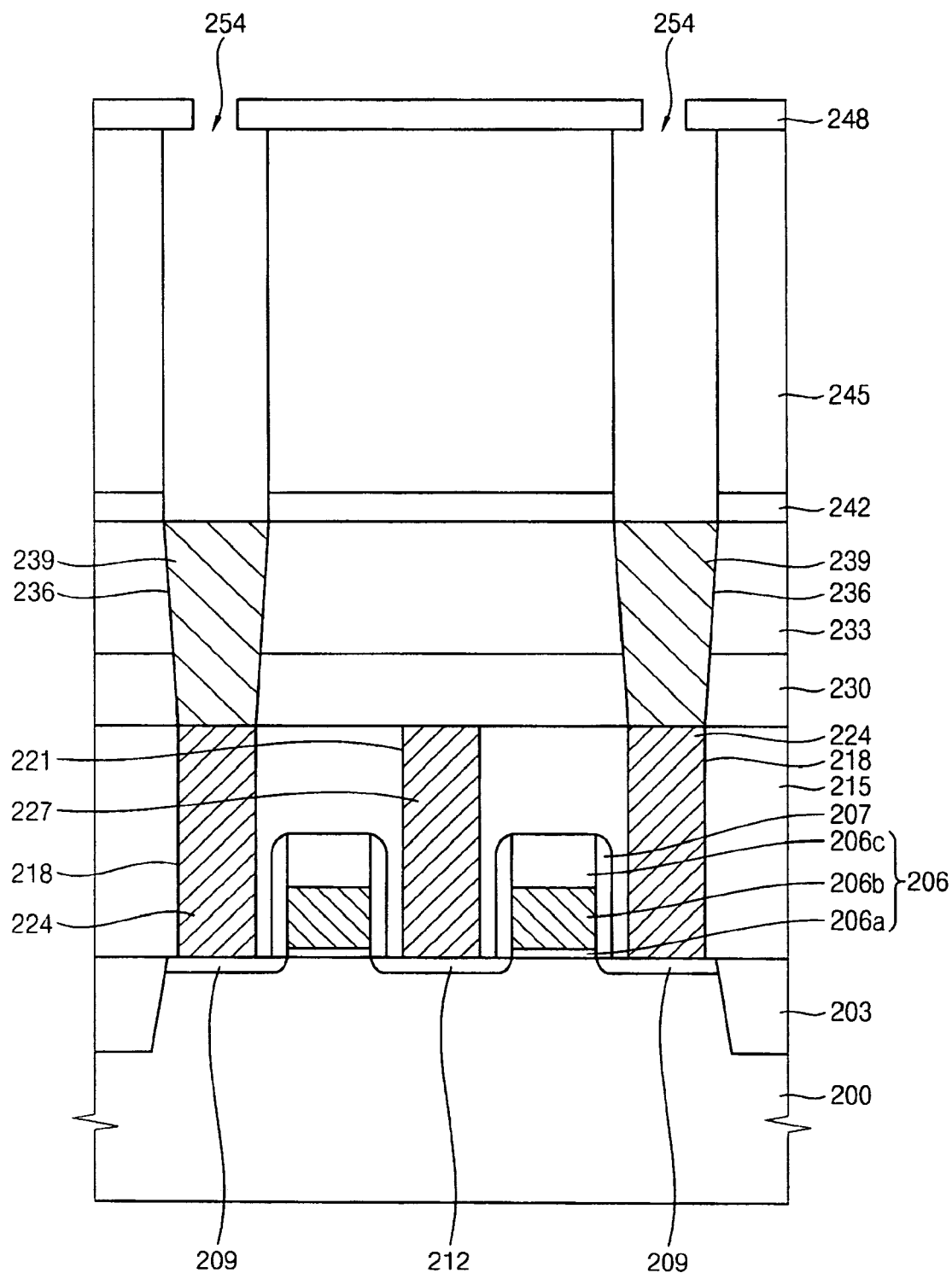

Referring to FIG. 3F, the etch stop layer 242 exposed through the second contact hole 252 may be partially removed by a third etching process. The third etching process may include a wet etching process using an etching solution including phosphoric acid. A third contact hole 254 exposing the third pad 239 may be formed by the third etching process. A native oxide layer may be formed on the third pad 239 exposed by the third contact hole 254. After forming the third contact hole 254, a fourth etching process may be performed for the third contact hole 254. The fourth etching process may serve to remove the native oxide layer formed on the third pad 239 and cure an etching damage provided by a formation of the third contact hole 254. In example embodiments, the fourth etching process may include a plasma native oxide cleaning (PNC) process. The PNC process may be performed using plasma generated from a fluorocarbon ($CF_4$) gas, an oxygen ($O_2$) gas, a hydrogen ($H_2$) gas, a nitrogen ($N_2$) gas and/or a mixture thereof.

The native oxide layer formed on the third pad 239 may have an etching rate substantially the same as that of the mold layer 245, so that the mold layer 245 may not be undesirably etched relative to the native oxide layer on the third pad 239 in the fourth etching process. An upper dimension of the third contact hole 254 may not be undesirably etched. A phenomenon connecting the lower electrode 263 (see FIG. 3H) of the capacitor to an adjacent lower electrode may be reduced or prevented. The difference in the widths between upper portions of the third contact hole 254 and lower portions of the third contact hole 254 may be insignificant, so that the third contact hole 254 may not have a step-shaped sidewall. When a conductive layer 257 (see FIG. 3G) is formed, the conductive layer 257 may be formed having a uniform thickness. The etch stop layer 242 also may not protrude into the third contact hole 254, so that the formation of lower electrode 263 having a narrower width may be reduced or prevented.

Figure 3G:
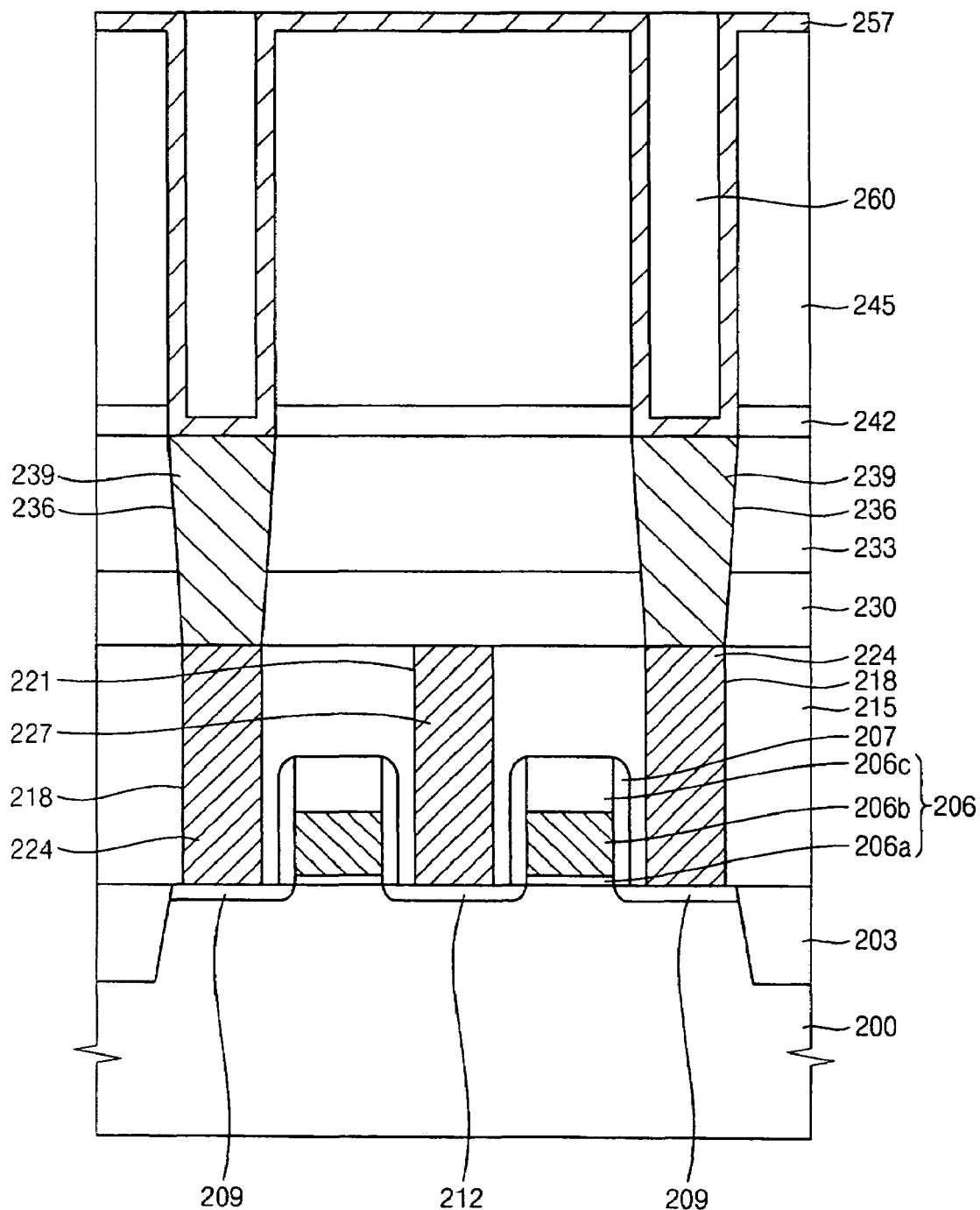

Referring to FIG. 3G, the mask pattern 248 may be removed from the mold layer 245. A third conductive layer 257 may be formed on the third pad 239 exposed by the third contact hole 254, the mold layer 245 and a sidewall of the third contact hole 254. The third conductive layer 257 may be formed using polysilicon doped with N type impurities and/or P type impurities, a metal and/or a conductive metal nitride. In example embodiments, the third conductive layer 257 may be formed by a low pressure CVD (LPCVD) process using polysilicon and/or a doping process to have a uniform thickness.

A sacrificial layer 260 may be formed on the conductive layer 257 to fill up the third contact hole 254. The sacrificial layer 260 may be formed using an oxide (e.g., BPSG, PSG, USG, SOG, FOX, TEOS, PE-TEOS, HDP-CVD oxide and/or any other suitable oxide). In example embodiments, the sacrificial layer 260 may be formed using an oxide substantially the same as that of the mold layer 245. In other example embodiments, the sacrificial layer 260 may be formed using an oxide different from that of the mold layer 245. The sacrificial layer 260 may protect the lower electrode 263 while the conductive layer 257 is partially etched to form the lower electrode 263.

In other example embodiments, the mask pattern 248 may not be removed from the mold layer 245 before forming the third conductive layer 257. The mask pattern 248 may serve as an etch stop layer while the third conductive layer 257 may be removed.

Figure 3H:
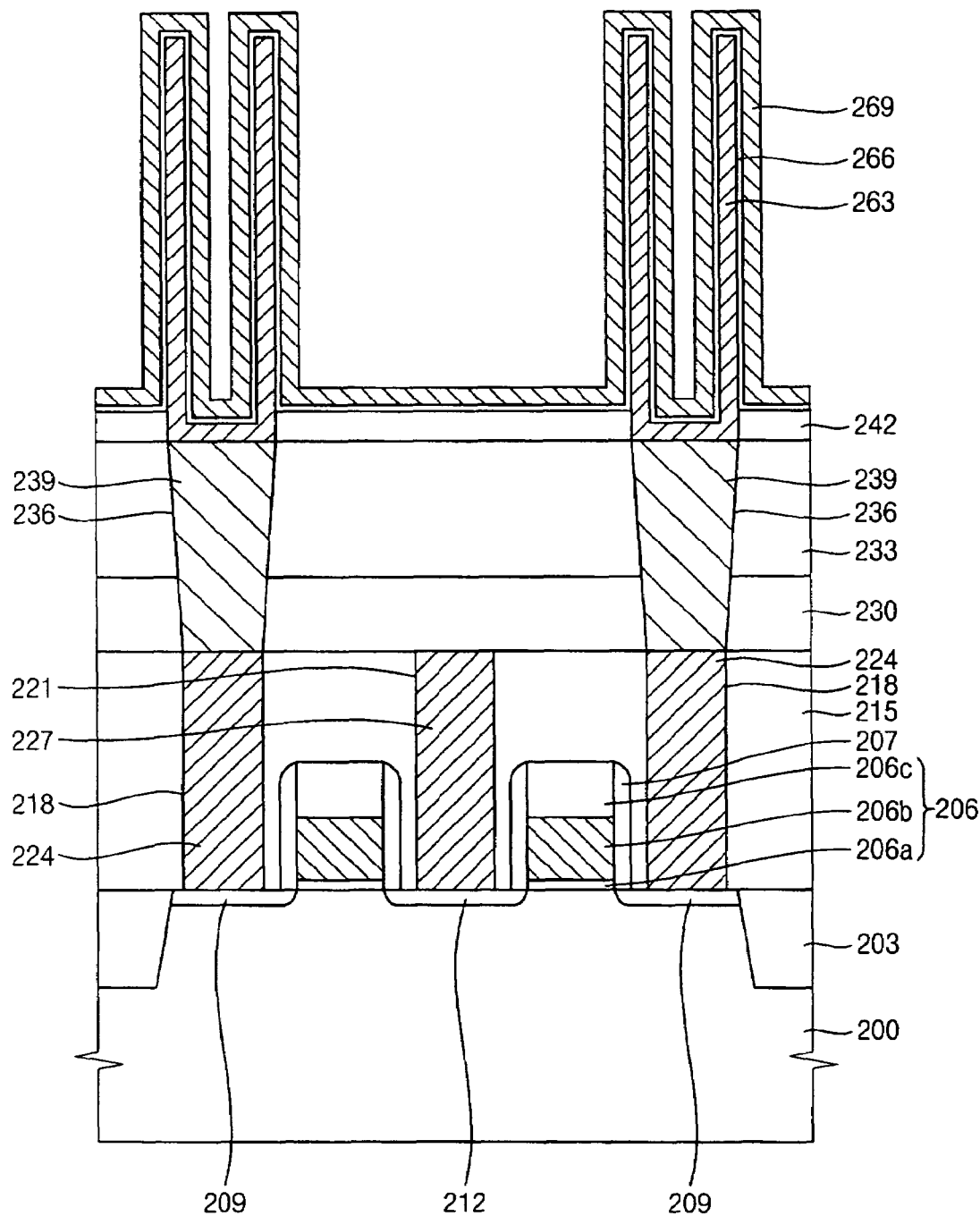

Referring to FIG. 3H, the sacrificial layer 260 and the third conductive layer 257 on the mold layer 245 may be removed by a CMP process, an etch back process and/or a combination process of CMP and etch back. The sacrificial layer 260 in the third contact hole 254 and the mold layer 256 may be removed by a fifth etching process. The lower electrode 263 may be formed. The lower electrode 263 may be divided into a unit cell. In example embodiments, the fifth etching process may be performed using a BOE solution and/or a hydrogen fluoride (HF) solution. A dielectric layer 266 may be formed on the lower electrode 263. An upper electrode 269 may be formed on the dielectric layer 266. A capacitor including the lower electrode 263, the dielectric layer 266 and the upper electrode 269 may be formed.

According to example embodiments, a dimension of a contact hole may be gradually expanded while forming a lower electrode of a capacitor. In an etching process of a native oxide layer on a pad connected with the lower electrode, the native oxide layer and a mold layer may be etched with the same etching rate. In the etching process of the native oxide layer, the mold layer may not be undesirably etched so that an upper dimension of the contact hole may be retarded or prevented from being expanded into a bottom dimension of the contact hole. The difference in widths between upper portions of the contact hole and lower portions of the contact hole may be insignificant, so that the contact hole may not have a step-shaped sidewall. A conductive layer may be formed having a uniform thickness in a subsequent process, thereby securing sufficient space for forming the lower electrode, a dielectric layer and an upper electrode.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of example embodiments. Accordingly, all such modifications are intended to be included within the scope of the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed and that modifications to the disclosed embodiments, as well as other embodiments, are intended to be included within the scope of the appended claims. Example embodiments are defined by the following claims, with equivalents of the claims to be included therein.

What is claimed is:

1. A method of manufacturing a capacitor, comprising:
   forming a mold layer on an etch stop layer;
   partially etching the mold layer by a first etching process to form a first contact hole exposing the etch stop layer;
   partially etching the mold layer by a second etching process to form a second contact hole having a dimension substantially wider than that of the first contact hole;
   selectively etching the exposed etch stop layer by a third etching process to form a third contact hole exposing a pad in an insulation layer;
   removing a native oxide layer on the exposed pad by a fourth etching process to form a capacitor contact hole, wherein the fourth etching process is performed without expanding the third contact hole;
   forming a lower electrode in the capacitor contact hole;
   forming a dielectric layer on the lower electrode; and
   forming an upper electrode on the dielectric layer.

2. The method of claim 1, further comprising, prior to partially etching the mold layer:
   forming the insulation layer on a substrate, the insulation layer including the pad therein; and
   forming the etch stop layer on the insulation layer.

3. The method of claim 1, wherein the fourth etching process is performed using plasma generated from at least one selected from the group including a fluorocarbon ($CF_4$) gas, an oxygen ($O_2$) gas, a hydrogen ($H_2$) gas and a nitrogen ($N_2$) gas.

4. The method of claim 1, wherein the third and the fourth etching processes are simultaneously performed.

5. The method of claim 1, wherein the second etching process includes a wet etching process using an SC1 solution or a hydrogen fluoride (HF) solution.

6. The method of claim 1, wherein the second etching process includes a dry etching process using an etching gas including hydrogen fluoride.

7. The method of claim 1, wherein the mold layer is formed using silicon oxide.

8. The method of claim 7, wherein the mold layer is formed using at least one selected from the group consisting of boro phosphorus silicate glass (BPSG), phosphorus silicate glass (PSG), undoped silicate glass (USG), spin on glass (SOG), flowable oxide (FOX), tetra ethyl ortho silicate (TEOS), plasma enhanced-TEOS (PE-TEOS) and high density plasma-chemical vapor deposition (HDP-CVD) oxide.

9. A method of manufacturing a semiconductor device, comprising:
   forming a contact region in a substrate;
   forming a pad electrically connected with the contact region on the substrate;
   forming an insulation layer on the substrate to cover the pad;
   forming an etch stop layer on the insulation layer;
   forming a mold layer on the etch stop layer;
   partially etching the mold layer by a first etching process to form a first contact hole exposing the etch stop layer;
   partially etching the mold layer by a second etching process to form a second contact hole having a dimension substantially wider than that of the first contact hole;
   selectively etching the exposed etch stop layer by a third etching process to form a third contact hole exposing the pad; and
   removing a native oxide layer on the exposed pad by a fourth etching process to form a capacitor contact hole, wherein the fourth etching process is performed without expanding the third contact hole.

10. The method of claim 2, wherein the substrate is at least one selected from the group consisting of a silicon wafer, a silicon-on-insulator (SOI) substrate and a metal oxide single crystal substrate.

11. The method of claim 1, wherein the pad is electrically connected with a lower conductive structure formed below the insulation layer and the pad.

12. The method of claim 1, wherein the insulation layer is formed using an oxide.

13. The method of claim 1, wherein the etch stop layer is formed using a material having an etching selectivity relative to those of the insulation layer and the mold layer.

14. The method of claim 1, further comprising:
    forming a mask layer on the mold layer;
    forming a photoresist pattern on the mask layer;
    patterning the mask layer using the photoresist pattern as an etching mask to form a mask pattern; and
    removing the photoresist pattern.

15. The method of claim 1, wherein the native oxide layer has an etching rate substantially the same as that of the mold layer.

16. The method of claim 1, wherein the fourth etching process includes an etching process using plasma.

17. The method of claim 1, further comprising:
    forming an insulating interlayer on the insulation layer including the pad, wherein the etch stop layer is formed on the insulating interlayer.

18. The method of claim 1, wherein a dimension of the capacitor contact hole is substantially the same as that of the third contact hole.

* * * * *